United States Patent
Song et al.

(10) Patent No.: US 7,633,117 B2
(45) Date of Patent: Dec. 15, 2009

(54) CAPACITORLESS DRAM WITH CYLINDRICAL AUXILIARY GATE AND FABRICATION METHOD THEREOF

(75) Inventors: Ki-whan Song, Seoul (KR); Hoon Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 520 days.

(21) Appl. No.: 11/649,478

(22) Filed: Jan. 4, 2007

(65) Prior Publication Data
US 2007/0161181 A1     Jul. 12, 2007

(30) Foreign Application Priority Data
Jan. 9, 2006    (KR)    ...................... 10-2006-0002378

(51) Int. Cl.
*H01L 29/792* (2006.01)
(52) U.S. Cl. .............................. 257/326; 257/E27.084; 257/E27.085; 257/E21.613; 257/E21.646; 438/142; 438/144
(58) Field of Classification Search ................ 257/326, 257/E27.084, E27.085, E21.613, E21.646; 438/142, 144
See application file for complete search history.

(56) References Cited

U.S. PATENT DOCUMENTS

| 5,698,869 | A | 12/1997 | Yoshimi et al. |
| 6,861,689 | B2 | 3/2005 | Burnett |
| 2005/0026354 | A1* | 2/2005 | Bhattacharyya ............. 438/232 |
| 2006/0278926 | A1* | 12/2006 | Mathew et al. ............... 257/347 |

FOREIGN PATENT DOCUMENTS

| JP | 8-213622 | 8/1996 |
| JP | 2003-31696 | 1/2003 |

* cited by examiner

*Primary Examiner*—Asok K Sarkar
(74) *Attorney, Agent, or Firm*—Mills & Onello, LLP

(57) ABSTRACT

Provided are a capacitorless DRAM (dynamic random access memory) and a fabrication method thereof. In a capacitorless DRAM, a pair of cylindrical auxiliary gates is formed within a bulk substrate. Thus, a volume of a channel body formed at a region where the cylindrical auxiliary gates contact with each other can be increased, while an area of a junction region where the channel body contact source and drain regions can be reduced. As a result, capacitance of the channel body can be increased, and a generation of leakage current through the second junction region can be reduced. The application of a back bias to the cylindrical auxiliary gates can improve a charge storage capability of the channel body.

21 Claims, 7 Drawing Sheets

CAPACITORLESS DRAM WITH CYLINDRICAL AUXILIARY GATE AND FABRICATION METHOD THEREOF

CROSS-REFERENCE TO RELATED PATENT APPLICATION

This application claims the benefit of Korean Patent Application No. 10-2006-0002378, filed on Jan. 9, 2006, in the Korean Intellectual Property Office, the contents of which are incorporated herein in their entirety by reference.

BACKGROUND OF THE INVENTION

1. Field of the Invention

The present invention relates to a semiconductor memory device, and more particularly, to a capacitorless dynamic random access memory (DRAM) and a fabrication method thereof.

2. Description of the Related Art

A typical DRAM is configured with one transistor and one capacitor. This structural configuration is denoted as "1T/1C" hereinafter. However, when 1T/1C DRAMs are embedded into a chip with other devices, formation of capacitors gets complicated due to the large integration scale of chips.

Hence, other types of DRAM, which can store data without a capacitor, have been suggested. One example of such a DRAM is a capacitorless DRAM that stores charges into a body of a substrate.

FIGS. 1A and 1B are cross-sectional views illustrating operation of a capacitorless DRAM. Referring to FIG. 1A, a high voltage is applied to a gate 20 and a drain 11 to generate excess holes 1, which are hot carriers, in a channel body 13 of a substrate. Since an oxide barrier 10 is formed beneath the channel body 13, the excess holes 1 cannot escape. As a result, the excess holes 1 are kept within the channel body 13. This confinement state of the excess holes 1 within the channel body 13 is stored as "1." Referring to FIG. 1B, current flows between a source 12 and the drain 11 to remove the excess holes 1 from the channel body 13. This escape state of the excess holes 1 from the channel body 13 is stored as "0." When a corresponding transistor is selected, depending on a storage state, i.e., "1" or "0," a threshold voltage level is different and a current level also varies. Using this variation, a read operation is executed.

The excess holes within the channel body generally disappear via recombination as time elapses. A time till the excess holes disappear is called retention time. Thus, a method of elongating the retention time is an important consideration for improving efficiency of a capacitorless 1T DRAM.

SUMMARY OF THE INVENTION

The present invention provides a capacitorless DRAM with a sufficient retention time.

The present invention also provides a method of fabricating a capacitorless DRAM with a sufficient retention time on a bulk substrate.

According to an aspect of the present invention, there is provided a capacitorless DRAM (dynamic random access memory) including: a substrate including device isolation regions; a pair of plug nodes formed apart within the substrate and having a top surface exposed to a surface of the substrate; a pair of cylindrical auxiliary gates connected with the plug nodes and contacting with each other within the substrate; source and drain regions disposed apart in portions of the substrate confined by the device isolation regions, the plug nodes and the cylindrical auxiliary gates; a channel body formed between the source and drain regions; and a main gate disposed over the channel body and insulated from the substrate.

The channel body may be formed at a region where the cylindrical auxiliary gates contact with each other.

A depth of a central portion of the channel body may be larger than that of a junction region at which the channel body contacts the source and drain regions.

The cylindrical auxiliary gates may be electrically connected with each other. In this case, the capacitorless DRAM may further include an auxiliary gate contact formed over the substrate, wherein the auxiliary gate contact is electrically connected with one of the plug nodes.

Alternatively, the cylindrical auxiliary gates may be electrically insulated from each other. In this case, the capacitorless DRAM may further include auxiliary gate contacts formed over the substrate, wherein the auxiliary gate contacts are electrically connected with the respective plug nodes.

The capacitorless DRAM may further include source and drain contacts formed over the substrate, wherein the source and drain contacts are electrically connected with the source and drain regions.

In one embodiment, the DRAM includes auxiliary gate contacts electrically connected with the plug nodes and formed over the substrate.

According to another aspect of the present invention, there is provided a capacitorless DRAM including: a substrate of a first conductivity type; a pair of plug nodes formed apart within the substrate in parallel and having a surface exposed to a top surface of the substrate; a pair of cylindrical auxiliary gates connected with bottom portions of the plug nodes and contacting with each other within the substrate; source and drain regions of a second conductivity type disposed apart within an active region confined by the device isolation regions, the plug nodes and the cylindrical auxiliary gates; a channel body of the first conductivity type formed between the source and drain regions; and a main gate formed over the channel body.

In one embodiment, the first conductivity type is a p-type and the second conductivity type is an n-type.

In one embodiment, a depth of a central portion of the channel body is larger than that of a junction region at which the channel body contacts the source and drain regions.

In one embodiment, an insulation layer is interposed between the plug nodes, the cylindrical auxiliary gates and the substrate.

According to another aspect of the present invention, there is provided a method of fabricating a capacitorless DRAM including: forming a pair of trenches apart from each other within a substrate including device isolation regions; forming a protection layer on sidewalls of the trenches; isotropically etching the bottom of the trenches to form cylindrical openings underneath the trenches with the protection layer, the cylindrical openings having a larger diameter than a width of the trenches and contacting the cylindrical openings with each other; removing the protection layer; forming an insulation layer on the substrate in contact with the trenches without the protection layer and the cylindrical openings; implanting ions of a first conductivity type onto an active region of the substrate confined by the trenches, the cylindrical openings and the device isolation regions; forming a conductive layer on the substrate doped with the ions of the first conductivity type such that the conductive layer fills the cylindrical openings and the trenches; patterning the conductive layer to form a main gate over the substrate and plug nodes and cylindrical auxiliary gates within the substrate; and implanting ions of a second conductivity type onto the active region using the main gate as a mask to form source and drain regions and a channel body between the source and drain regions.

According to another aspect of the present invention, there is provided a method of fabricating a capacitorless DRAM including: forming a pair of trenches apart from each other within a substrate including device isolation regions; forming a protection layer on sidewalls of the trenches; isotropically etching the bottom of the trenches to form cylindrical openings underneath the trenches with the protection layer, the cylindrical openings having a larger diameter than a width of the trenches and contacting the cylindrical openings with each other; removing the protection layer; forming an insulation layer on the substrate in contact with the trenches without the protection layer and the cylindrical openings; implanting ions of a first conductivity type onto an active region of the substrate confined by the trenches, the cylindrical openings and the device isolation regions; filling the cylindrical openings and the trenches with a conductive layer to form plug nodes and cylindrical auxiliary gates within the substrate; forming a main gate over the substrate in which the cylindrical auxiliary gates are formed; and implanting ions of a second conductivity type onto the active region using the main gate as a mask to form source and drain regions and a channel body between the source and drain regions.

Forming the trenches may include forming a hard mask layer on the substrate; forming a photoresist pattern on the hard mask layer, the photoresist pattern exposing regions in which the trenches are to be formed; and etching portions of the substrate using the photoresist pattern as a mask.

The channel body may be formed at a region where the cylindrical auxiliary gates contact with each other.

A depth of a central portion of the channel body may be larger than that of a junction region at which the channel body contacts the source and drain regions.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

In a capacitorless 1T DRAM which stores charges into a channel body of a substrate, a data retention time gets shorter as charges that are stored into the channel body leak out of the channel body or flow into the channel body. Therefore, one method of increasing the retention time is to increase the volume of a channel body into which charges are stored, decrease a cross-sectional area of junction regions through which charges leak out of the channel body, wherein the junction regions are formed between the channel body and each of a source and a drain, or to apply a back-gate bias to the channel body in order for the channel body to hold a high amount of charges.

Figure 1A:
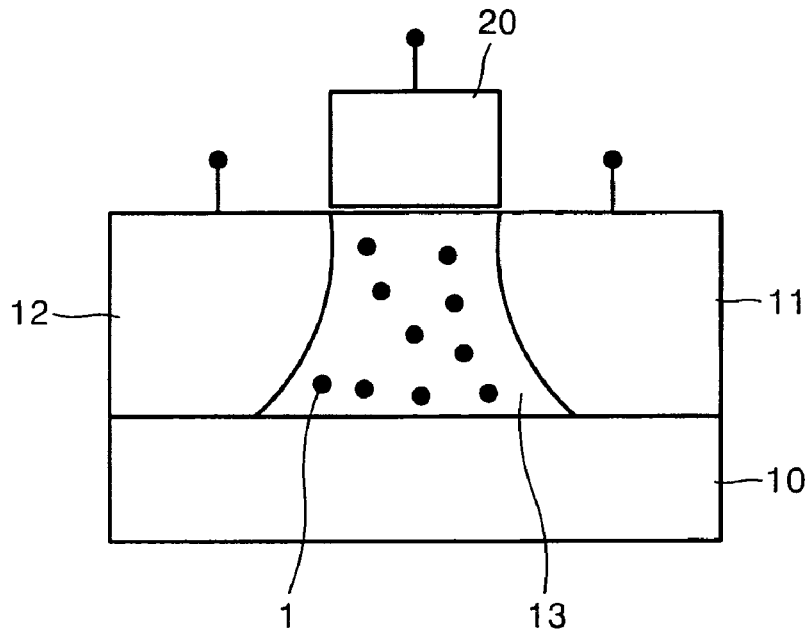
FIGS. 1A and 1B are cross-sectional views illustrating operation of a conventional capacitorless 1T DRAM.
Figure 1B:
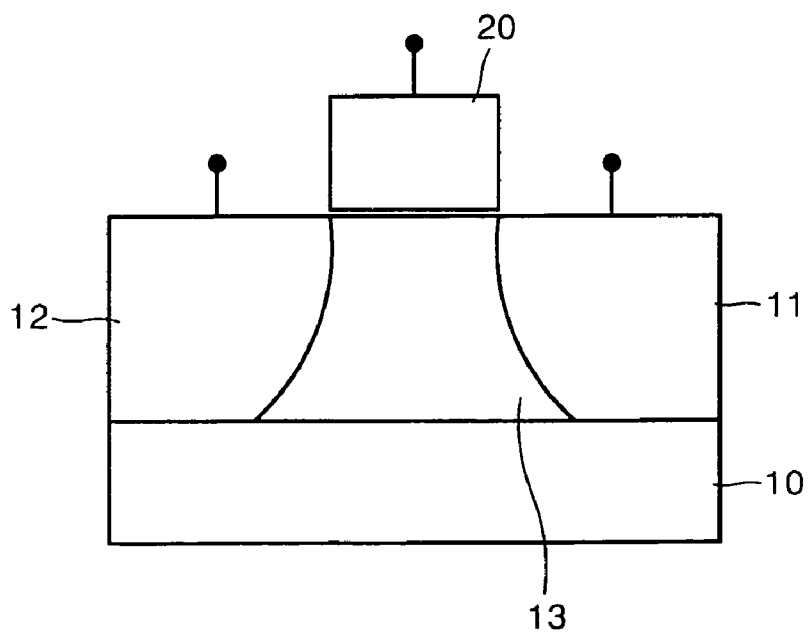
Figure 2:
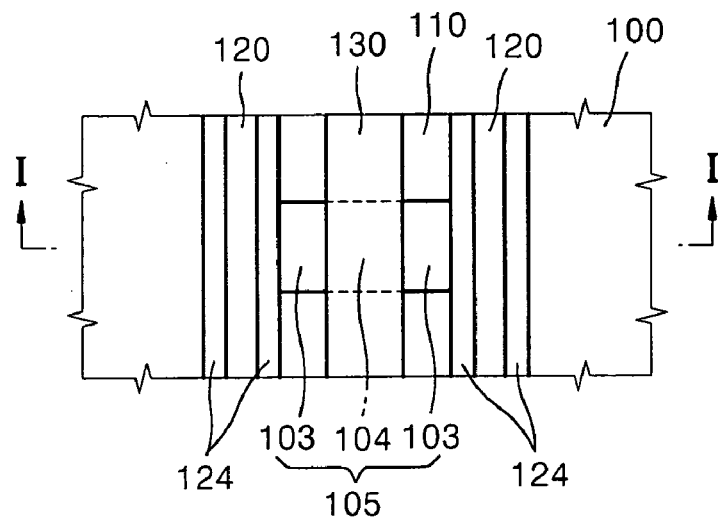
FIG. 2 is a top view illustrating a capacitorless DRAM cell according to an embodiment of the present invention.
Figure 3:
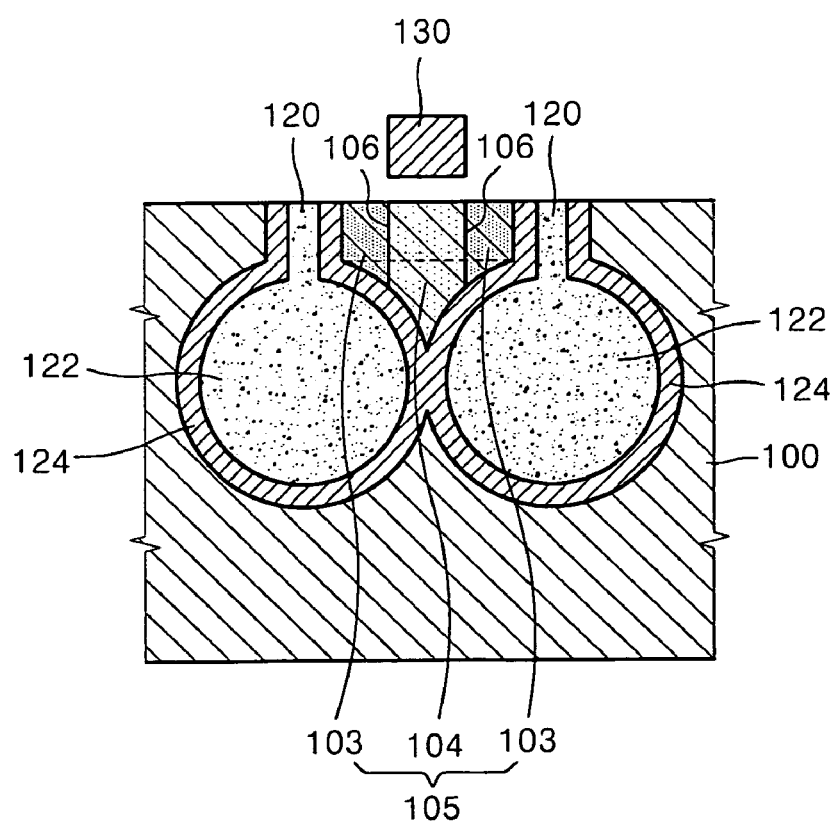
FIG. 3 is a cross-sectional view of the capacitorless DRAM cell taken along the line I-I illustrated in FIG. 2.

FIG. 2 is a top view illustrating a capacitorless DRAM cell according to an embodiment of the present invention. FIG. 3 is a cross-sectional view of the capacitorless DRAM cell taken along the line I-I illustrated in FIG. 2. Hereinafter, the capacitorless DRAM cell illustrated in FIG. 3 will be described first for the better understanding of the present embodiment.

Referring to FIG. 3, an active region 105 is surrounded by plug nodes 120 and cylindrical auxiliary gates 122. The plug nodes 120 are formed in portions of a substrate 100 disposed at both sides of the active region 105. The cylindrical auxiliary gates 122 are connected with the respective plug nodes 120 and contact with each other. The plug nodes 120 and the cylindrical auxiliary gates 122 are insulated from the substrate 100 by an insulation layer 124 formed around the plug nodes 120 and the cylindrical auxiliary gates 122. As illustrated in FIG. 3, the cylindrical auxiliary gates 122 may be insulated from each other by the insulation layer 124 disposed between the cylindrical auxiliary gates 122. Alternatively, the insulation layer 124 may not be formed between the cylindrical auxiliary gates 122, so that the cylindrical auxiliary gates 122 are electrically connected with each other.

Source and drain regions 103 are formed apart within the active region 105, and a channel body 104 is formed therebetween. A main gate 130 is formed over the channel body 104.

The channel body 104 is formed where the cylindrical auxiliary gates 122 contact with each other. Thus, compared with the case of using a conventional silicon-on-insulator (SOI) substrate, a volume of the channel body 104 is increased as large as an area beneath a dotted portion illustrated in FIG. 3. Hence, the channel body 104 can accommodate a higher amount of charges than other conventional ones. When the substrate 100, the source and drain regions 103 and the channel body 104 are a p-type, an n-type and a p-type, respectively, i.e., an n-channel metal oxide semiconductor field effect transistor (MOSFET), charges that are stored into the channel body 104 becomes holes.

Because of the cylindrical auxiliary gates 122, bottom portions of the source and drain regions 103 are allocated above a bottom portion of the channel body 104, and a depth of an individual boundary region 106 between each of the source and drain regions 103 and the channel body 104 is smaller than that of the channel body 104. Therefore, an area of the individual boundary region 106 is decreased. As mentioned above, charges may leak out of the channel body 104 through these boundary regions 106. Thus, the decreased area of the boundary regions 106 can reduce leakage of charges.

Applying a back bias to the cylindrical auxiliary gates 122 enables the channel body 104 to accommodate a high amount of charges. The cylindrical auxiliary gates 122 and the insulation layer 124 confine the bottom surface of the active region. Therefore, according to the present embodiment, device isolation, which is achieved with an SOI substrate, can still be achieved even with using a bulk substrate.

With reference to FIG. 2, the active region 105 is confined by device isolation regions 110 and the plug nodes 120. The device isolation regions 110 are disposed at the front and back sides of the active region 105. The plug nodes 120 surrounded by the insulation layer 124 (refer to FIG. 3) are disposed at the lateral sides of the active region 105 in parallel to the main gate 130. Since the plug nodes 120 and the cylindrical auxiliary gates 122 are surrounded by the insulation layer 124, the plug nodes 120, the cylindrical auxiliary gates 122 and the device isolation regions 110 isolate the active regions 105 electrically.

The plug nodes 120 may be formed in a straight line extending in parallel to the main gate 130 or in a short straight line extending over a number of cells or one cell. Although not illustrated, in the case that the plug nodes 120 are formed as being separated from each other in each cell, a contact connected to the individual plug node 120 needs to be formed in each cell to apply a back bias to the cylindrical auxiliary gates 122. However, in the case that the plug nodes 120 are formed commonly as being laid over a number of cells, one contact may be formed in a common cell. When the plug nodes 120 are formed in the shape of an extended straight line, contacts may be formed outside the cell region. The cylindrical auxiliary gates 122 on the left and right sides of the active region 105 are connected with each other without being separated by the insulation layer 124, a contact may be formed in one of the left and right sides of the active region 105.

FIGS. 4A through 4J are cross-sectional views illustrating a method of fabricating a capacitorless DRAM cell according to an embodiment of the present invention.

Figure 4A:
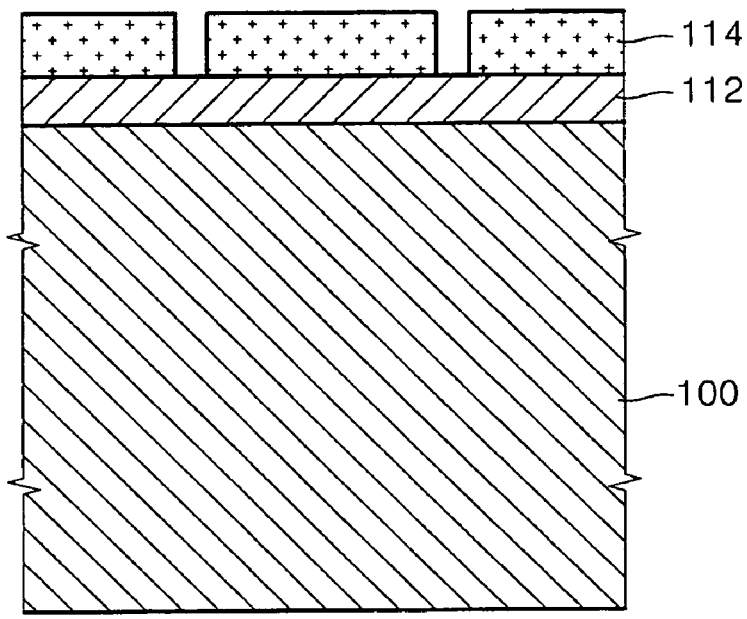
FIGS. 4A through 4J are cross-sectional views illustrating a method of fabricating a capacitorless DRAM cell according to an embodiment of the present invention.

Referring to FIG. 4A, a hard mask layer 112 is formed on a substrate 100 in which device isolation regions (not shown) are formed, and a photoresist pattern 114 is formed on the hard mask layer 112. The hard mask layer 112 may be formed of silicon nitride.

Figure 4B:
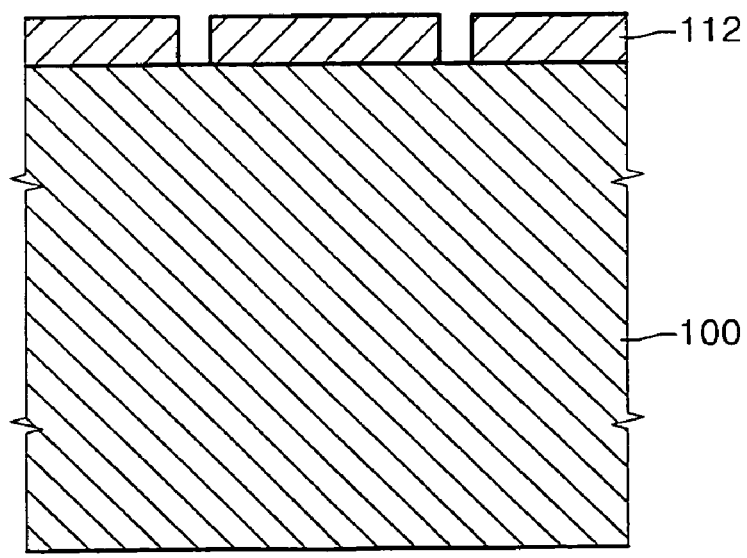

Referring to FIG. 4B, the hard mask layer 112 is etched using the photoresist pattern 114 as a mask to form a hard mask pattern 112'.

Figure 4C:
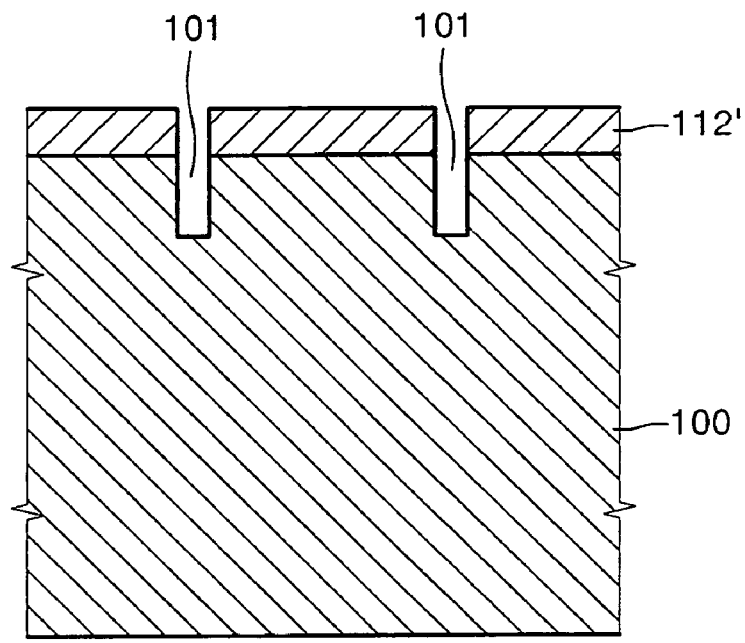

Referring to FIG. 4C, portions of the substrate 100 are etched using the hard mask pattern 112' as a mask to form trenches 101. A depth of the individual trench 101 is determined by considering a volume of a channel body to be formed.

Figure 4D:
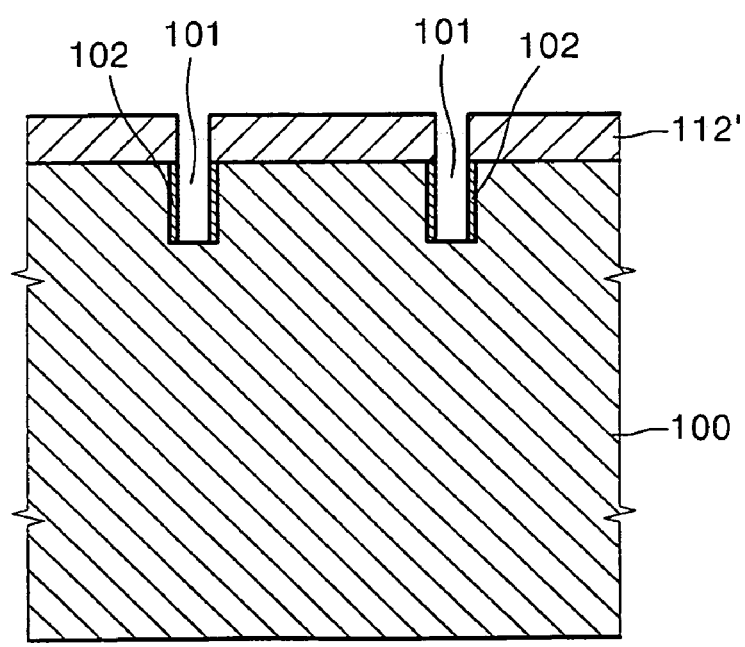

Referring to FIG. 4D, an oxide layer 102 is formed on sidewalls of the trenches 101. The oxide layer 102 may be formed via a thermal oxidation process.

Figure 4E:
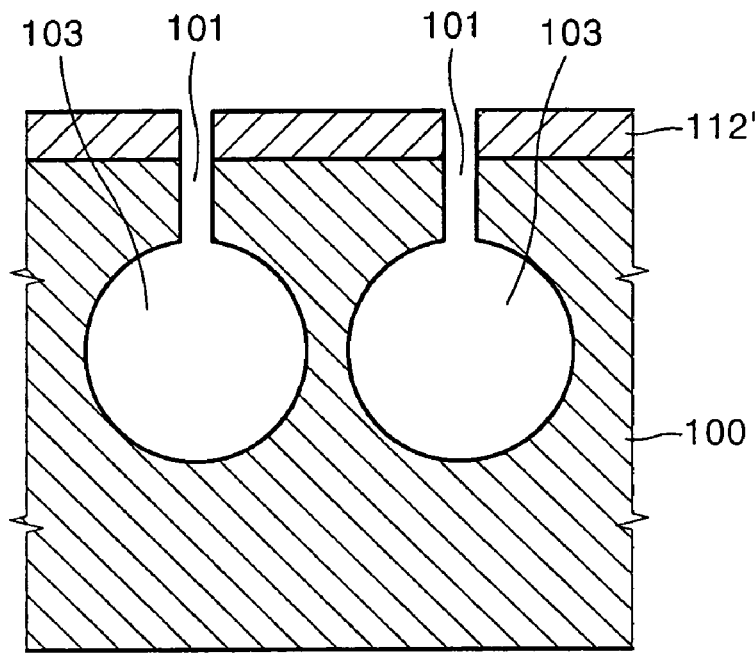

Referring to FIG. 4E, an isotropic etching process is performed on the bottom of the trenches 101 to form cylindrical openings 103 underneath the trenches 101. The isotropic etching process may be a wet etching process. During the isotropic etching process performed on the bottom of the trenches 101, the trenches 101 are not extended toward the lateral sides of the trenches 101 since the sidewalls of the trenches 101 are protected by the oxide layer 102.

Figure 4F:
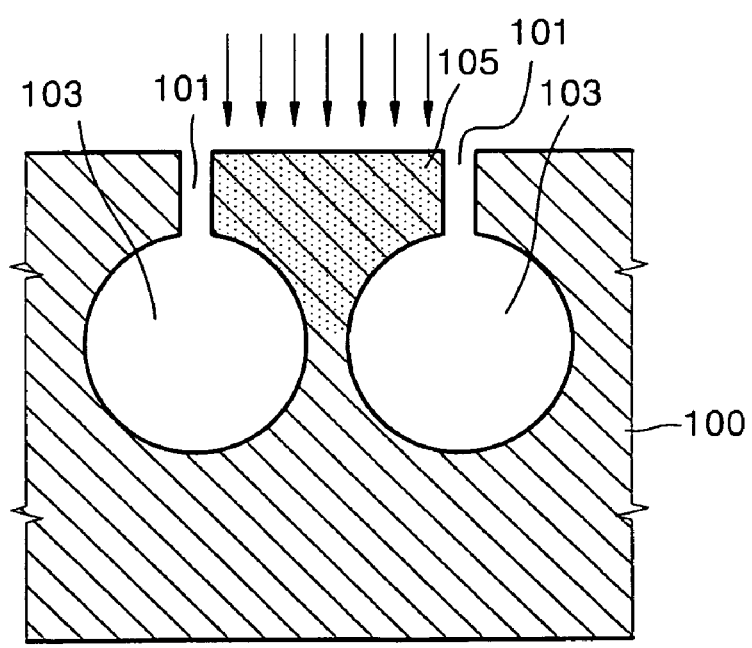

Referring to FIG. 4F, an ion implantation process is performed on an active region 105 of the substrate 100 to form a channel. For instance, when an n-type channel of an nMOSFET is formed, a p-type ion implantation process is performed. The p-type ion implantation process dopes the active region 105 with p-type impurities.

Figure 4G:
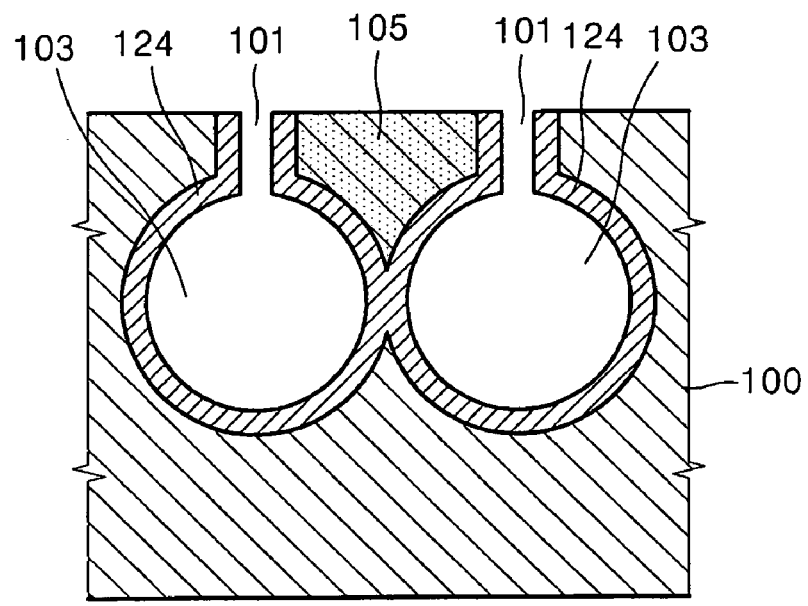

Referring to FIG. 4G, an insulation layer 124 is formed on sidewalls of the trenches 101 and the cylindrical openings 103. For instance, the insulation layer 124 may be formed via a thermal oxidation process.

Figure 4H:
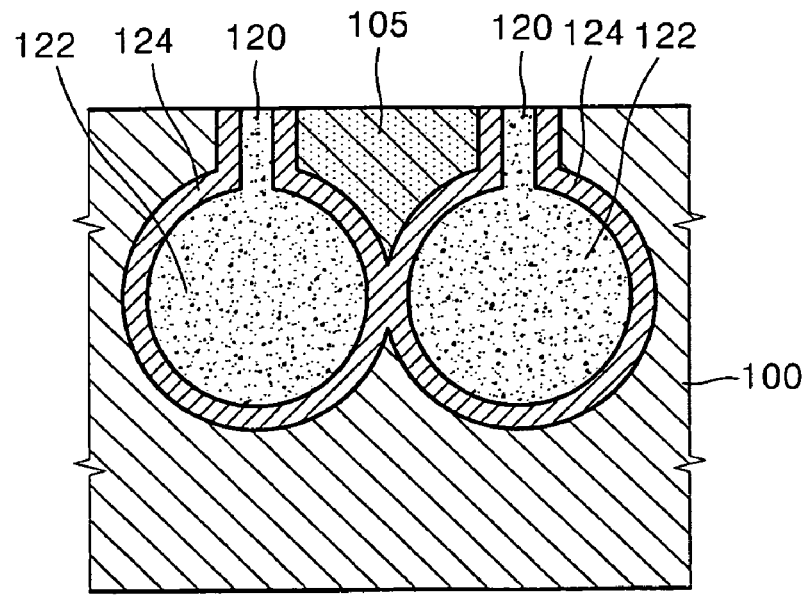

Referring to FIG. 4H, a conductive layer is formed on the entire surface of the substrate 100 such that the conductive layer fills the trenches 101 and the cylindrical openings 103 on which the insulation layer 124 is formed, and a chemical mechanical polishing process is performed to remove the conductive layer formed on the substrate 100. The conductive layer may be formed of polycrystalline silicon or metal. As the conductive layer fills the trenches 101 and the cylindrical openings 103, plug nodes 120 and cylindrical auxiliary gates 122 are formed within the substrate 100. The insulation layer 124 insulates the plug nodes 120 and the cylindrical auxiliary gates 122 from the substrate 100.

The cylindrical auxiliary gates 122 as described in FIGS. 4A through 4H may be formed by a process of fabricating a sphere-shaped-recess-channel-array transistor (SRCAT) of a 1T/1C DRAM described in an article entitled "Technology for 70 nm DRAM feature size and beyond" in 2005 *VLSI Technology*, incorporated herein in its entirety by reference. The application of this fabrication process can improve reliability.

Figure 4I:
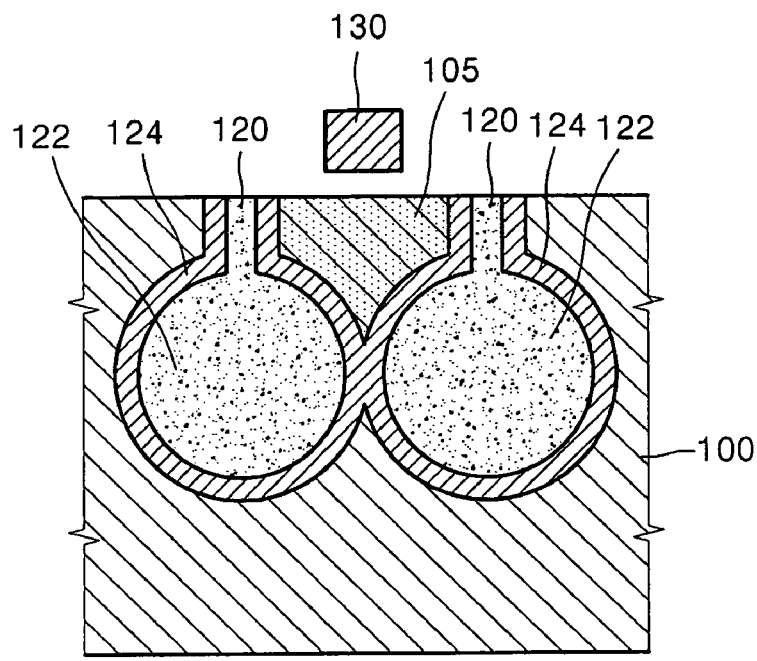

Referring to FIG. 4I, a typical gate process is performed to form a main gate 130 over the active region 105 subjected to the channel ion implantation process. In the present embodiment, the plug nodes 120 and the cylindrical auxiliary gates 122 are formed by filling the trenches 101 and the cylindrical openings 103 with the conductive layer, and the main gate 130 is formed separately thereafter. As another method, the conductive layer is formed on the entire surface of the substrate 100 such that the conductive layer fills the trenches 101 and the cylindrical openings 103, and the conductive layer is patterned to simultaneously form the plug nodes 120, the cylindrical auxiliary gates 122 and the main gate 130.

Figure 4J:
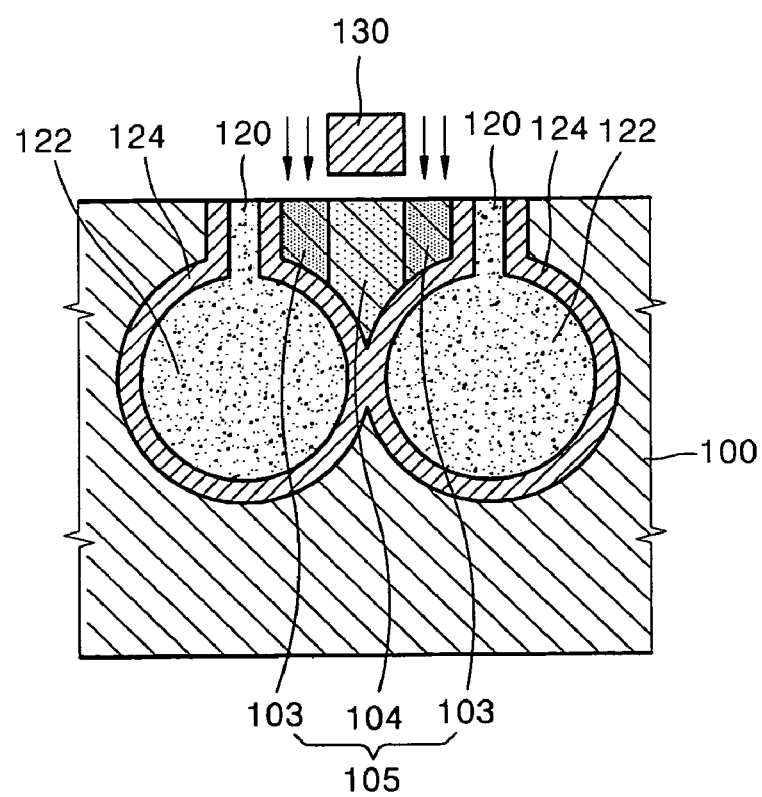

Referring to FIG. 4J, an ion implantation process is performed using the main gate 130 as a mask to form source and drain regions 103.

According to the exemplary embodiments of the present invention, a pair of cylindrical auxiliary gates is formed within a bulk substrate, and thus, a volume of a channel body formed where the cylindrical auxiliary gates contact with each other can be increased as well as an area of a region at which source and drain regions contact the channel body can be reduced. As a result, a capacitance level of the channel body can be increased, and generation of leakage current through junction regions between the channel body and each of the source and drain regions can be reduced. Also, a charge storage capability of the channel body can be improved by applying a back bias to the cylindrical auxiliary gates. The improvement in the charge storage capability can elongate a data retention time.

Since an insulation layer formed on the cylindrical auxiliary gates serves as a burial oxide layer in an SOI substrate, a 1T DRAM can be fabricated in a bulk substrate. Hence, manufacturing costs can be reduced. The application of the aforementioned SRCAT process of fabricating a 1T DRAM can improve process reliability.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A capacitorless DRAM (dynamic random access memory) comprising:
    a substrate including device isolation regions;
    a pair of plug nodes formed apart within the substrate and having a top surface exposed to a surface of the substrate;
    a pair of cylindrical auxiliary gates connected with the plug nodes and contacting with each other within the substrate;
    source and drain regions disposed apart in portions of the substrate confined by the device isolation regions, the plug nodes and the cylindrical auxiliary gates;
    a channel body formed between the source and drain regions; and
    a main gate disposed over the channel body and insulated from the substrate.

2. The capacitorless DRAM of claim 1, wherein the channel body is formed where the cylindrical auxiliary gates contact with each other.

3. The capacitorless DRAM of claim 2, wherein a depth of a central portion of the channel body is larger than that of a junction region at which the channel body contacts the source and drain regions.

4. The capacitorless DRAM of claim 1, wherein the cylindrical auxiliary gates make an electrical connection with each other.

5. The capacitorless DRAM of claim 4, further comprising an auxiliary gate contact electrically connected with one of the plug nodes and formed over the substrate.

6. The capacitorless DRAM of claim 1, wherein the cylindrical auxiliary gates are electrically insulated from each other.

7. The capacitorless DRAM of claim 6, further comprising auxiliary gate contacts electrically connected with the respective plug nodes and formed over the substrate.

8. The capacitorless DRAM of claim 1, further comprising source and drain contacts electrically connected with the source and drain regions and formed over the substrate.

9. The capacitorless DRAM of claim 1, further comprising auxiliary gate contacts electrically connected with the plug nodes and formed over the substrate.

10. A capacitorless DRAM comprising:
a substrate of a first conductivity type;
a pair of plug nodes formed apart within the substrate in parallel and having a top surface exposed to a surface of the substrate;
a pair of cylindrical auxiliary gates connected with bottom portions of the plug nodes and contacting with each other within the substrate;
source and drain regions of a second conductivity type disposed apart within an active region confined by the device isolation regions, the plug nodes and the cylindrical auxiliary gates;
a channel body of the first conductivity type formed between the source and drain regions; and
a main gate formed over the channel body.

11. The capacitorless DRAM of claim 10, wherein the first conductivity type is a p-type and the second conductivity type is an n-type.

12. The capacitorless DRAM of claim 10, wherein a depth of a central portion of the channel body is larger than that of a junction region at which the channel body contacts the source and drain regions.

13. The capacitorless DRAM of claim 10, wherein an insulation layer is interposed between the plug nodes, the cylindrical auxiliary gates and the substrate.

14. A method of fabricating a capacitorless DRAM comprising:
forming a pair of trenches apart from each other within a substrate including device isolation regions;
forming a protection layer on sidewalls of the trenches;
isotropically etching the bottom of the trenches to form cylindrical openings underneath the trenches with the protection layer, the cylindrical openings having a larger diameter than a width of the trenches and contacting the cylindrical openings with each other;
removing the protection layer;
forming an insulation layer on the substrate contacting the trenches without the protection layer and the cylindrical openings;
implanting ions of a first conductivity type onto an active region of the substrate confined by the trenches, the cylindrical openings and the device isolation regions;
forming a conductive layer on the substrate doped with the ions of the first conductivity type such that the conductive layer fills the cylindrical openings and the trenches;
patterning the conductive layer to form a main gate over the substrate and plug nodes and cylindrical auxiliary gates within the substrate; and
implanting ions of a second conductivity type onto the active region using the main gate as a mask to form source and drain regions and a channel body between the source and drain regions.

15. The method of claim 14, wherein the forming of the trenches includes:
forming a hard mask layer on the substrate;
forming a photoresist pattern on the hard mask layer, the photoresist pattern exposing regions in which the trenches are to be formed; and
etching portions of the substrate using the photoresist pattern as a mask.

16. The method of claim 14, wherein the channel body is formed where the cylindrical auxiliary gates contact with each other.

17. The method of claim 14, wherein a depth of a central portion of the channel body is larger than that of a junction region at which the channel body contacts the source and drain regions.

18. A method of fabricating a capacitorless DRAM comprising:
forming a pair of trenches apart from each other within a substrate including device isolation layers;
forming a protection layer on sidewalls of the trenches;
isotropically etching the bottom of the trenches to form cylindrical openings underneath the trenches with the protection layer, the cylindrical openings having a larger diameter than a width of the trenches and contacting the cylindrical openings with each other;
removing the protection layer;
forming an insulation layer on the substrate contacting the trenches without the protection layer and the cylindrical openings;
implanting ions of a first conductivity type onto an active region of the substrate confined by the trenches, the cylindrical openings and the device isolation regions;
filling the cylindrical openings and the trenches with a conductive layer to form plug nodes and cylindrical auxiliary gates within the substrate;
forming a main gate over the substrate in which the cylindrical auxiliary gates are formed; and
implanting ions of a second conductivity type onto the active region using the main gate as a mask to form source and drain regions and a channel body between the source and drain regions.

19. The method of claim 18, wherein the forming of the trenches includes:
forming a hard mask layer on the substrate;
forming a photoresist pattern on the hard mask layer, the photoresist pattern exposing regions in which the trenches are to be formed; and
etching portions of the substrate using the photoresist pattern as a mask.

20. The method of claim 18, wherein the channel body is formed where the cylindrical auxiliary gates contact with each other.

21. The method of claim 18, wherein a depth of a central portion of the channel body is larger than that of a junction region at which the channel body contacts the source and drain regions.

* * * * *